United States Patent
Montree et al.

(10) Patent No.: US 6,403,426 B1
(45) Date of Patent: Jun. 11, 2002

(54) METHOD OF MANUFACTURING A SEMICONDUCTOR DEVICE

(75) Inventors: Andreas H. Montree; Jurriaan Schmitz; Pierre H. Woerlee, all of Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/527,202

(22) Filed: Mar. 16, 2000

(30) Foreign Application Priority Data

Mar. 17, 1999 (EP) .............................. 99200812

(51) Int. Cl.⁷ ........................................... H01L 21/336
(52) U.S. Cl. ........................ 438/291; 438/229; 438/301
(58) Field of Search ................................ 438/291, 296, 438/249, 301, 305, 592, 65 S (56) References Cited

U.S. PATENT DOCUMENTS

| | | | |
|---|---|---|---|
| 5,773,348 A | 6/1998 | Wu ............................ | 438/305 |
| 5,856,225 A | * 1/1999 | Lee et al. .................... | 438/291 |
| 5,994,179 A | 11/1999 | Masuoka .................... | 438/227 |
| 6,159,782 A | * 12/2000 | Xiang et al. ................ | 438/197 |
| 6,271,094 B1 | * 8/2001 | Boyd et al. ................ | 438/287 |

FOREIGN PATENT DOCUMENTS

| | | |
|---|---|---|
| EP | 0905761 A2 | 3/1999 |
| FR | 2757312 A1 | 6/1998 |
| JP | 04155838 | 5/1992 |
| JP | 09321151 | 12/1997 |

\* cited by examiner

*Primary Examiner*—John F. Niebling
*Assistant Examiner*—Walter L. Lindsay, Jr.
(74) *Attorney, Agent, or Firm*—Aaron Waxler (57) ABSTRACT

In a method of manufacturing a semiconductor device comprising a transistor having a gate insulated from a channel region at a surface of a semiconductor body by a gate dielectric, an active region 4 of a first conductivity type is defined at the surface 2 of the semiconductor body 1, and a patterned layer is applied consisting of refractory material, which patterned layer defines the area of the planned gate to be provided at a later stage of the process and acts as a mask during the formation of a source zone 11 and a drain zone 12 of a second conductivity type in the semiconductor body 1. In a next step, a dielectric layer 14 is provided in a thickness which is sufficiently large to cover the patterned layer, which dielectric layer 14 is removed over part of its thickness by means of a material removing treatment until the patterned layer is exposed, which patterned layer is removed, thereby forming a recess 15 in the dielectric layer 14 at the area of the planned gate. Then, impurities are introduced via the recess 15 into the channel region 13 of the semiconductor body 1 in a self-registered way by using the dielectric layer 14, as a mask and an insulating layer is applied, forming the gate dielectric, on which insulating layer a conductive layer is applied thereby filling the recess, which conductive layer is shaped into the gate of the transistor.

12 Claims, 5 Drawing Sheets

METHOD OF MANUFACTURING A SEMICONDUCTOR DEVICE

BACKGROUND OF THE INVENTION

The invention relates to a method of manufacturing a semiconductor device comprising a semiconductor body which is provided at a surface with a transistor having a gate insulated from a channel region at the surface of the semiconductor body by a gate dielectric, the gate having an area, by which method an active region of a first conductivity type adjoining the surface is defined in the semiconductor body, and a patterned layer is applied defining the area of the planned gate to be provided at a later stage of the process, after which a dielectric layer is applied, which dielectric layer is provided with a recess at the area of the planned gate by removing the patterned layer, after which impurities are introduced via the recess into the channel region of the semiconductor body in a self-registered way by using the dielectric layer as a mask, and an insulating layer is applied, forming the gate dielectric of the transistor, on which insulating layer a conductive layer is applied thereby filling the recess, which conductive layer is shaped into the gate of the transistor.

A method of manufacturing a semiconductor device of the kind mentioned in the opening paragraph is known from U.S. Pat. No. 5,773,348. In the known method, a stacked pad oxide/nitride layer is formed on a surface of the semiconductor body, on which stacked pad oxide/nitride layer a patterned photoresist layer is applied, forming the area of the gate planned, hereinafter also called the planned gate area. An oxide layer is selectively deposited on the stacked pad oxide/nitride layer, after which the patterned photoresist layer is removed. In a subsequent implantation process, impurities are introduced via the planned gate area into the semiconductor body by using the oxide layer as an ion implantation mask, thereby providing the semiconductor body with an anti-punchthrough impurity region. Then, nitride spacers are formed within the planned gate area at the sidewalls of the oxide layer and the stacked pad oxide/nitride layer is removed within the same region. A gate oxide layer is subsequently applied within the planned gate area, followed by the deposition of an amorphous silicon layer filling the planned gate area, which amorphous silicon layer is shaped into the gate of the transistor. Finally, the oxide layer and the underlying stacked pad oxide/nitride layer are removed and a salicide process including a two-stage annealing treatment with temperatures as high as 750 to 900° C. is carried out in order to form self-aligned contacts and shallow junction source and drain zones.

Whether impurities are introduced into the semiconductor body by means of diffusion from a chemical source provided at the surface of the semiconductor body or by means of ion implantation, in both cases a high-temperature annealing treatment with temperatures as high as about 900° C. needs to be carried out.

A disadvantage of the known method is that the formation of the gate and the introduction of the impurities via the planned gate area into the semiconductor body take place prior to the formation of the source zone and the drain zone and, hence, prior to the high-temperature two-stage annealing treatment. Because the gate is subjected to the high temperatures of this annealing treatment, serious constraints are imposed on the choice of process compatible materials for the gate. Moreover, the high-temperature anneal will also adversely redistribute the impurities that have been locally introduced into the semiconductor body for punchthrough suppression.

SUMMARY OF THE INVENTION

It is an object of the invention to provide a method of manufacturing a semiconductor device of the kind mentioned in the opening paragraph, which increases the flexibility as regards the implementation of process compatible materials for the gate in a conventional CMOS process flow, and which allows a local introduction of impurities via the planned gate area into the semiconductor body without an adverse redistribution of the introduced impurities at a later stage of the process.

According to the invention, this object is achieved in that the patterned layer consisting of refractory material is applied, which patterned layer acts as a mask during the formation of a source zone and a drain zone of a second conductivity type in the semiconductor body, after which the dielectric layer is applied in a thickness which is sufficiently large to cover the patterned layer, which dielectric layer is removed over part of its thickness by means of a material removing treatment until the patterned layer is exposed, which patterned layer is then removed.

The above-stated measures in accordance with the invention prevent the gate as well as the impurities, which have been locally introduced into the semiconductor body via the recess at the planned gate area, from being exposed to the high temperatures of the annealing treatment associated with the formation of the source zone and the drain zone of the transistor. In this way, the flexibility as regards the use of process compatible materials for the gate is substantially increased, and redistribution of the locally introduced impurities is counteracted.

The planned gate area is defined by depositing a patterned layer, which is composed of refractory material to withstand the high temperatures of the annealing treatment associated with the subsequent formation of the source zone and the drain zone of the transistor. Prior to the removal of the patterned layer, a relatively thick dielectric layer is applied in a thickness which is sufficiently large to cover the patterned layer. The dielectric layer is subsequently removed over part of its thickness by means of, for example, chemical-mechanical polishing until the patterned layer is exposed, which patterned layer is removed by means of selective etching, thereby providing the dielectric layer with a recess at the planned gate area. After the removal of the patterned layer, a dip-etch may be carried out in order to remove a surface layer composed of, for instance, silicon oxide, which may have been advantageously applied to the surface of the semiconductor body in order to protect the semiconductor body against contamination. Impurities are then introduced via the recess into the channel region of the semiconductor body in a self-registered way using the dielectric layer as a mask. Either before or after the introduction of the impurities, an insulating layer is applied, forming the gate dielectric of the transistor. Then, a conductive layer is applied, which fills the recess and is shaped into the gate of the transistor.

The impurities may be introduced into the channel region of the semiconductor body by means of a diffusion process, involving two steps in general. First, the impurities are placed on or near the surface of the semiconductor body by a gaseous deposition step or by coating the surface with a layer containing the desired impurities. This is followed by an annealing treatment in order to further drive-in the impurities into the semiconductor body by means of diffusion. An alternative to the diffusion process is ion implantation. The desired impurities are first ionized and then accelerated by an electric or magnetic field to a high energy level, typically in the range from 1 to 500 keV. A beam of the accelerated high-energy ions strikes the surface of the semiconductor body and penetrates exposed regions thereof. The penetration is typically less than a micrometer below the surface, and considerable damage is done to the crystal lattice during implantation. Consequently, an annealing treatment is required in order to repair the damage the crystal lattice, and to activate the as-implanted impurities.

Due to its ability to more precisely control the number of impurities introduced into the semiconductor body, ion implantation is preferred to diffusion. Moreover, ion implantation allows impurity introduction into the semiconductor body with much less lateral distribution than via diffusion and, hence, allows devices to be manufactured with features of smaller dimensions.

For MOS transistors with channel lengths below about 2 µm, short-channel effects start to play an important role in respect of device behavior. In this respect, particularly the short-channel effects known as punchthrough and short-channel threshold-voltage shift become dominant.

Punchthrough is a phenomenon associated with the merging of the depletion regions of the source zone and the drain zone. That is, as the channel gets shorter, the space between the edges of the depletion regions becomes smaller, provided the channel-region doping is kept constant as the channel length decreases. When the channel length becomes approximately equal to the sum of the widths of the depletion regions of the source zone and the drain zone, punchthrough is established.

Experimentally, it is observed that, as the channel length decreases to less than about 2 µm, the threshold voltage shifts to below the long-channel values, which effect is referred to as the short-channel threshold-voltage shift. The fraction of the depletion charge within the channel region under the gate, which is induced by the source zone and the drain zone, is insignificant for long-channel transistors, but becomes significant for short-channel transistors whose channel length approaches the sum of the widths of the depletion regions of the source zone and the drain zone. Consequently, less charge is needed to cause inversion, and the threshold voltage is reduced.

On the above grounds, it is advantageous to provide the channel region of a short-channel transistor with an impurity region for threshold voltage correction and/or punchthrough suppression. In order to reach these effects, the doping of the semiconductor body within the channel region under the gate generally has to be increased. Impurities for threshold voltage correction and/or punchthrough suppression can be implanted into the channel region substantially perpendicularly to the surface of the semiconductor body. However, in order to counteract channeling of the impurities along crystal directions and planes, it is advantageous to implant the impurities into the channel region at a small angle of a few, for instance seven, degrees with the normal to the surface of the semiconductor body by tilting the semiconductor body before implantation. It is to be noted that an implantation for punchthrough suppression in general leads to an increase of the threshold voltage as well.

Conventionally, the impurities for threshold voltage correction and/or punchthrough suppression are implanted after definition of active regions adjoining the surface of the semiconductor body and after application of a gate oxide layer covering the entire surface of the semiconductor body. In this way, the introduced impurities are laterally distributed over the entire active regions, and counter-doping is required for subsequent formation of source and drain zones in regions adjoining the surface of the semiconductor body. The need of counter-doping for source zone and drain zone formation is counteracted by the method of the invention by locally implanting the above-mentioned impurities via the recess into the channel region of the transistor only.

If the impurities for threshold voltage correction and/or punchthrough suppression are implanted via the recess, substantially perpendicularly to the surface or at a small angle of a few degrees with the normal to the surface of the semiconductor body, the channel region is implanted over practically its entire length, thereby increasing the threshold voltage throughout the range of channel lengths. Consequently, when a process flow for semiconductor devices comprising both long-channel and short-channel transistors is optimized in such a way that the short-channel transistors can operate at a nominal threshold voltage, the long-channel transistors inevitably obtain a higher threshold voltage as well. In order to provide the channel region only partially, that is to say at its edges, with impurities and, hence, suppress the increase of the threshold voltage for long-channel transistors, it is advantageous to implant the impurities at an acute angle with the normal to the surface of the semiconductor body. Obviously, the maximum angle at which the impurities can be implanted into the channel region is dependent on the aspect ratio of the recess in the dielectric layer.

The patterned layer defining the planned gate area and being composed of refractory material, may comprise, for instance, silicon nitride or aluminum oxide. However, in order to match the process flow to conventional CMOS processing, the patterned layer applied advantageously comprises silicon. In this respect, polycrystalline silicon, or possibly amorphous silicon or $Ge_xSi_{(1-x)}$ may be applied, with the fraction of germanium x lying in the range between 0 and 1.

Experimentally, it is observed that the moment of stopping the chemical-mechanical polishing (CMP) of the dielectric layer is rather critical if the patterned layer is composed of silicon. If the CMP process is stopped too early, oxide residue is left on the patterned layer, which hinders the subsequent removal of the patterned layer. If the CMP process is carried on too long, the definition of the height of the planned gate is adversely affected. In order to improve the height definition of the process, it is preferred to apply the patterned layer as a double-layer including a first sub-layer comprising the silicon and on top thereof, a second sub-layer composed of a material having a larger resistance to the material removing treatment than silicon and being selectively etchable with respect to the dielectric layer. Thus, the second sub-layer will act as an etch stop layer during the removal of the dielectric layer. In this respect it is advantageous to apply silicon nitride as the second sub-layer and silicon oxide as the dielectric layer. Alternatively, aluminum oxide can be used instead of silicon nitride and/or BPSG (borophosphosilicate glass) instead of silicon oxide. The second sub-layer is selectively removed from the first sub-layer, after which the first sub-layer is selectively removed. After the introduction of the impurities via the recess into the channel region of the semiconductor body and the application of the insulating layer forming the gate dielectric, the conductive layer is applied thereby filling the recess. In order to obtain a compact gate structure of the transistor, the conductive layer is preferably shaped into the gate by maskless removal of said layer until either the insulating layer or the dielectric layer is exposed. In this way the gate is recessed in the dielectric layer. The above mentioned maskless removal of the conductive layer is preferably accomplished by means of chemical-mechanical polishing (CMP). A subsequent maskless removal of the insulating layer is not required, but can be beneficial in case the insulating layer comprises a high-dielectric constant material.

The gate of the transistor and, hence, the conductive layer from which it is formed, advantageously comprises a metal instead of conventional polycrystalline silicon. In contrast with polycrystalline silicon, metals intrinsically have a relatively low resistance and do not suffer from detrimental depletion effects. In this respect a low-resistance metal such as aluminum, tungsten, copper or molybdenum can be advantageously applied. In case a metal is used, the conductive layer is preferably applied as a double-layer including a layer comprising the metal and, on top thereof, a layer acting as adhesion layer and/or barrier layer. In this respect titanium (Ti) may be applied as adhesion layer and titanium nitride (TiN) or titanium tungsten (TiW) as barrier layer. It is to be noted that application of a metal gate in the prior art method would lead to melting in the case of an aluminum gate or cause detrimental interaction between the metal gate and the gate dielectric upon exposure to the high temperatures of the annealing treatment associated with the formation of the source zone and the drain zone of the transistor. In the method of the present invention the gate, once formed, is not exposed to high temperatures at subsequent stages of the process flow.

In order to improve the performance of the transistor, it may be advantageous to apply a dielectric material with a dielectric constant higher than that of silicon oxide ($\epsilon\sim 4$) as the gate dielectric and, hence, as the insulating layer from which the latter is formed. In this respect, tantalum oxide ($Ta_2O_5$; $\epsilon\sim 20$–25), aluminum oxide ($Al_2O_3$; $\epsilon\sim 10$) or silicon nitride ($Si_3N_4$ $\epsilon\sim 7$) can be applied to advantage, as these materials are deposited in a conformal and reproducible way by means of chemical vapor deposition (CVD). It is to be noted that application of a gate dielectric composed of a high dielectric constant material in the prior art method may lead to degradation of the dielectric properties of the material upon exposure to the high temperatures of the annealing treatment associated with the formation of the source zone and the drain zone of the transistor. In the method of the present invention, the gate dielectric, once formed, is not exposed to such high temperatures at subsequent stages of the process flow.

BRIEF DESCRIPTION OF THE DRAWING

These and other aspects of the invention will be apparent from and elucidated with reference to the embodiments described hereinafter, and shown in the drawing. In the drawing.

DESCRIPTION OF THE PREFERRED EMBODIMENTS

Although the invention is illustrated hereinafter on the basis of a single transistor, it will be evident to those skilled in the art that the invention may be advantageously applied in the manufacture of CMOS and BICMOS integrated circuits known per se.

FIGS. 1 to 9 show in diagrammatic cross-sectional views successive stages in the manufacture of a semiconductor device comprising a transistor, using a first embodiment of the method in accordance with the invention.

Figure 1:
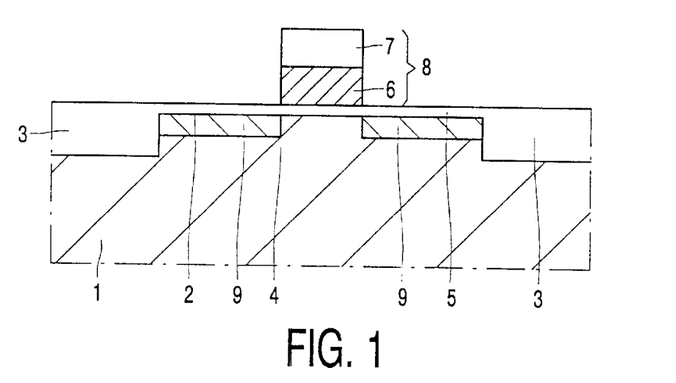
FIGS. 1 to 9 show in diagrammatic cross-sectional views successive stages in the manufacture of a semiconductor device comprising a transistor, using a first embodiment of the method in accordance with the invention.

With reference to FIG. 1, a semiconductor body 1 of a first conductivity type, in the present example a silicon body of, for instance, p-type conductivity, is provided at a surface 2 with relatively thick oxide field insulating regions 3, which are at least partly recessed in the semiconductor body 1 and which define an active region 4 in which a transistor, in the present example of the NMOS-type, is to be manufactured. The thick oxide insulating regions 3 are formed in a usual way by means of LOCOS (LOCal Oxidation of Silicon) or STI (Shallow Trench Isolation). Subsequently, the surface 2 of the semiconductor body 1 is provided with a layer 5 composed of, for instance, silicon oxide, which is covered with a patterned layer 8 defining the area of a planned gate to be provided at a later stage of the process, which area is called planned gate area hereinafter. In the present example, the patterned layer 8 is obtained by depositing a double-layer including a first sub-layer 6 of, for instance, polycrystalline silicon which may be doped with a dopant such as phosphorus or possibly boron, and, on top thereof, a second sub-layer 7 composed of, for instance, silicon nitride, and by patterning the double-layer for instance in a usual photolithographic way. Instead of silicon nitride any other suitable material such as, for instance, aluminum oxide or a combination of materials can be used. Instead of polycrystalline silicon, amorphous silicon or $Ge_xSi_{1-x}$ may be used, with x representing the fraction of germanium lying in the range between 0 and 1. It is to be noted that the patterned layer may also be a single layer, composed of polycrystalline silicon, amorphous silicon or $Ge_xSi_{1-x}$, or any other suitable refractory material such as, for example, silicon nitride or aluminum oxide. Furthermore, the presence of the layer 5, which may have been advantageously applied in order to protect the semiconductor body against contamination, is not necessary. After applying the patterned layer 8, source/drain extensions 9 of a second, opposite conductivity type, in the present example n-type, are formed on opposite sides of the patterned layer 8 by means of a self-aligned implantation of a relatively light dose of, for instance, phosphorus or arsenic using the patterned layer 8 together with the oxide field insulating regions 3 as a mask.

Figure 2:
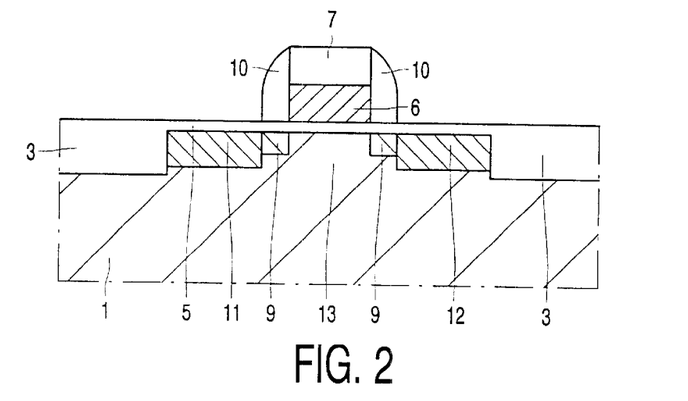

Subsequently, the patterned layer 8 is provided with sidewall spacers 10, e.g. in a known way, such as by means of deposition and anisotropic etch-back of a silicon oxide layer (FIG. 2). After formation of the sidewall spacers 10, a highly-doped source zone 11 and drain zone 12 of the second conductivity type, in the present example n-type, are formed on opposite sides of the sidewall spacers 10 by means of a self-aligned implantation of a heavier dose of, for instance, phosphorus or arsenic using the oxide field insulating regions 3 together with the patterned layer 8 and the sidewall spacers 10 as a mask. It is to be noted, that a channel region 13 is enclosed by the extended source zone 11,9 and the extended drain zone 12,9.

Figure 3:
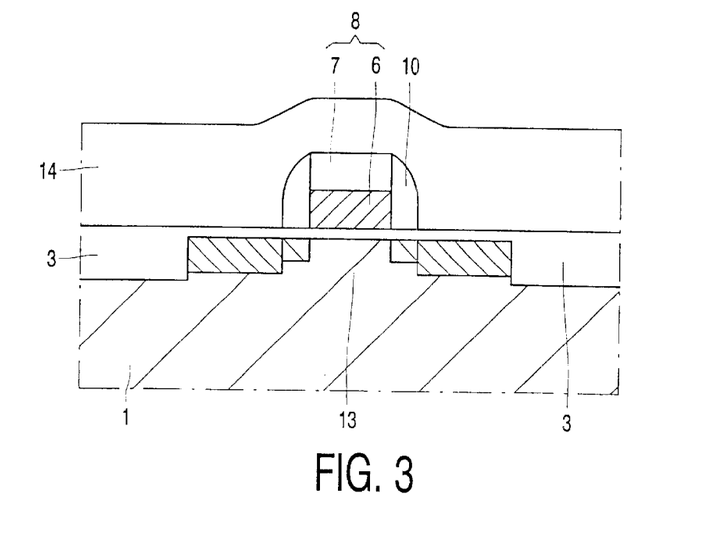

With reference to FIG. 3, a relatively thick dielectric layer 14, in the present example composed of silicon oxide, is applied in a thickness which is sufficiently large to cover the patterned layer 8. Obviously, other suitable electrically insulating materials such as PSG (phosphosilicate glass) or BPSG (borophosphosilicate glass) may be used as well.

Figure 4:
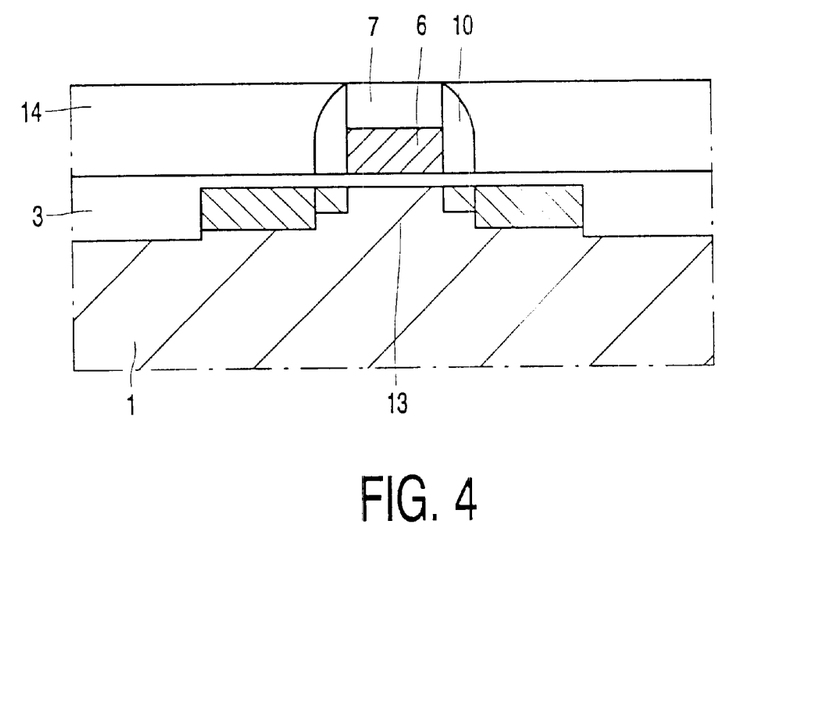
Figure 5:
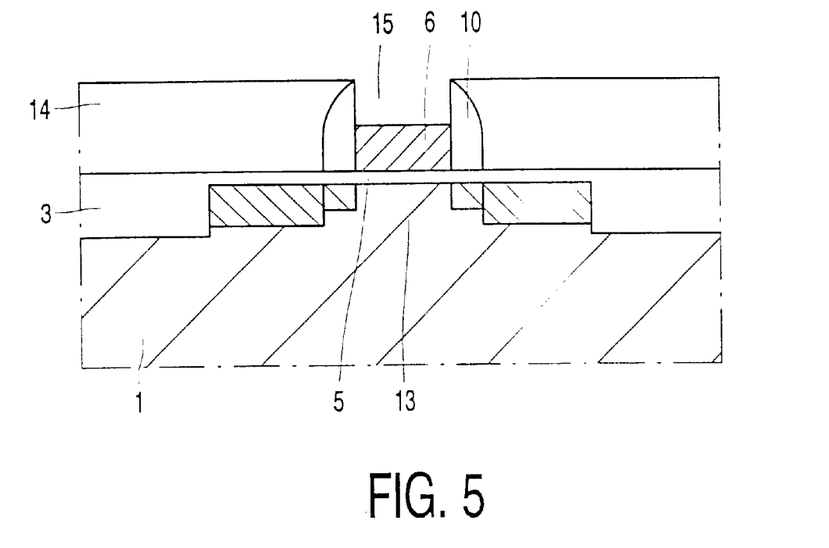

Subsequently, the dielectric layer 14 is removed over part of its thickness until the patterned layer 8 is exposed (FIG. 4). This can be accomplished by means of, for example, chemical-mechanical polishing (CMP), e.g. using a commercially available slurry. During the material removing treatment, the second sub-layer 7, in the present example composed of silicon nitride, will act as a stop layer.

In a next step (FIG. 5), the second sub-layer 7, composed of silicon nitride in the present example, is removed selectively with respect to the dielectric layer 14 and the sidewall spacers 10, both composed of silicon oxide in the present example, by means of, for instance, wet etching using a mixture of hot phosphoric acid and sulphuric acid. In this way the dielectric layer 14 is provided with a recess 15.

Figure 6:
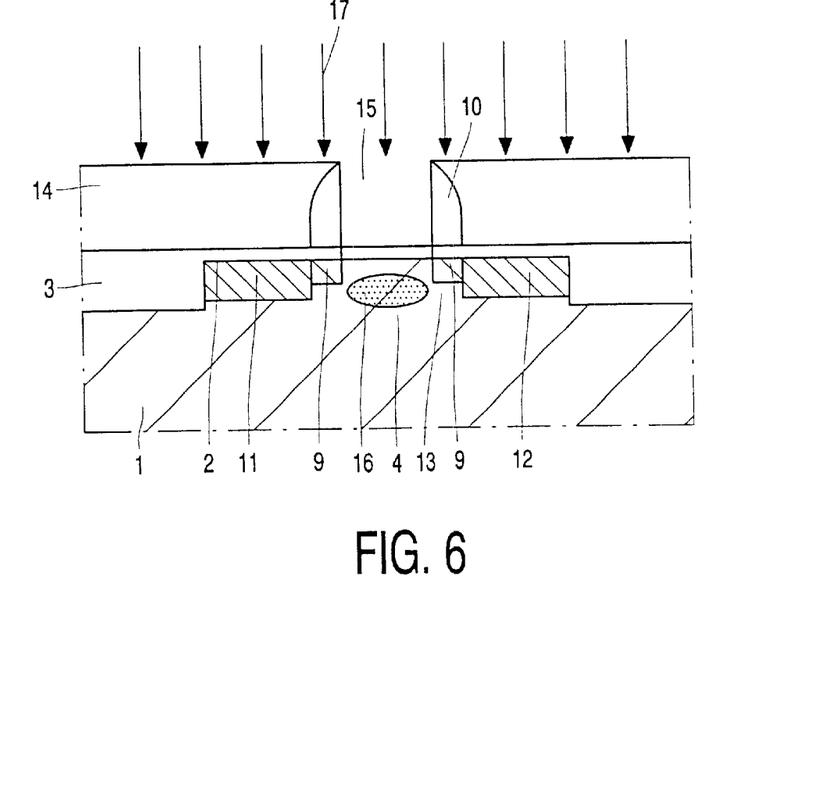

With reference to FIG. 6, the first sub-layer 6 and the layer 5 are removed in two separate etching steps. The first sub-layer 6, in the present example composed of polycrystalline silicon, can be removed selectively by means of wet etching using, for instance, a hot KOH solution or by means of plasma etching with, for instance, a HBr/Cl$_2$ mixture. The layer 5, in the present example composed of silicon oxide, can be removed by means of wet etching using HF. In a next step, the channel region 13 of the semiconductor body 1 is provided with an impurity region 16 of the first conductivity type, in the present example p-type, by introducing p-type impurities such as, for instance, boron (B), via the recess 15 into the channel region 13 in a self-registered way by using the dielectric layer 14 as a mask. The impurity region 16 can be applied as, for instance, a shallow region to correct the threshold voltage of the NMOS transistor and/or a deeper region to suppress punchthrough between the extended source zone 11,9 and the extended drain zone 12,9 of the NMOS transistor. Introduction of the p-type impurities into the semiconductor body 1 can be accomplished by means of diffusion from a chemical source provided at the surface 2 of the semiconductor body 1. However, for reasons given earlier, the p-type impurities are introduced preferably by means of ion implantation as depicted by arrows 17. In this respect, boron may be implanted at an energy lying in the range from about 20 to 60 keV, in a dose of about $2.10^{13}$ atoms/cm$^2$. It is understood by those skilled in the art that phosphorus (P) ions or arsenic (As) ions may be implanted in a PMOS transistor for similar reasons. For instance, phosphorus may be implanted at an energy lying in the range from about 100 to 130 keV, in a dose of about $2.10^{13}$ atoms/cm$^2$, whereas arsenic may be implanted at an energy lying in the range from about 180 to 240 keV, is a dose of about $2.10^{13}$ atoms/cm$^2$. The implantation may be carried out substantially perpendicularly to the surface 2 of the semiconductor body 1. However, in order to counteract channeling of the impurities along crystal directions and planes, it is advantageous to perform the implantation at a small angle of a few, for instance seven, degrees with the normal to the surface 2 of the semiconductor body 1 by tilting the semiconductor body 1 before implantation. It is to be noted that the shallow region for threshold voltage correction and the deeper region for punchthrough suppression may be formed in two implantation steps carried out at different energies, or simultaneously in one implantation step at the same energy.

Figure 7:
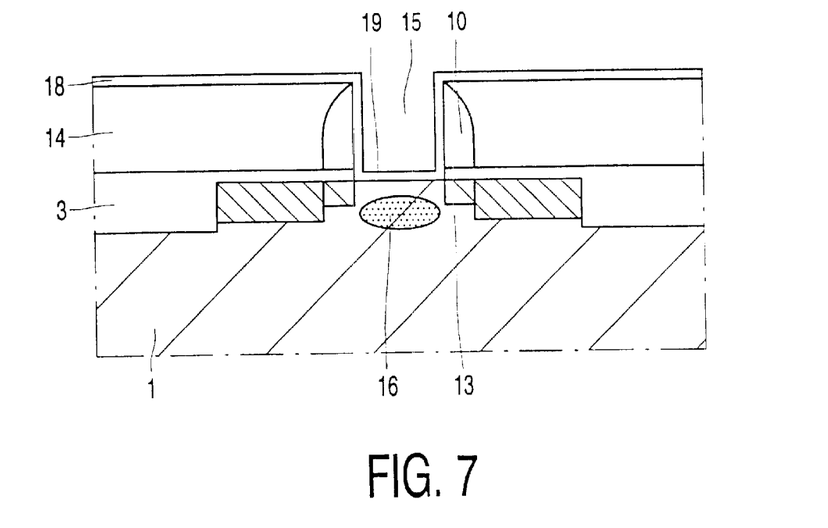

As shown in FIG. 7, an insulating layer 18 is provided on all exposed surfaces, forming a gate dielectric 19 of the transistor. The insulating layer 18 may be composed of silicon oxide, however, a dielectric material with a dielectric constant higher than that of silicon oxide, such as tantalum oxide, aluminum oxide or silicon nitride may be more favorable. If silicon oxide is to be applied for the gate dielectric 19, it may be obtained by means of, for instance, chemical vapor deposition or thermal oxidation of silicon. The high dielectric-constant materials tantalum oxide, aluminum oxide and silicon nitride can be applied, for example, by means of chemical vapor deposition (CVD).

It is to be noted that the above-mentioned ion implantation for punchthrough suppression and/or threshold voltage correction may be carried out after the application of the insulating layer 18 as well. It is known that a thin layer composed of, for instance, silicon oxide, which is present at the surface of the semiconductor body, may improve the characteristics of ion implantation. However, if the insulating layer 18 is composed of a dielectric material with a high dielectric constant, the high-temperature anneal associated with the ion implantation, with temperatures as high as about 900° C., may degrade the dielectric properties of the material applied.

Figure 8:
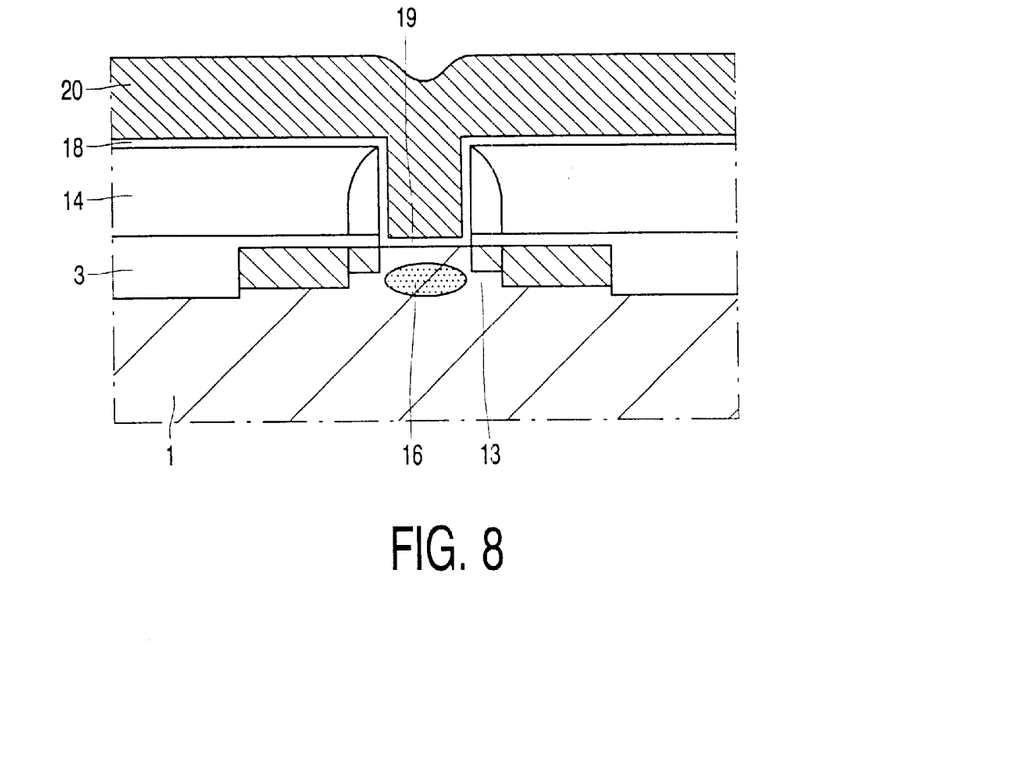

With reference to FIG. 8, a conductive layer 20 is applied on the insulating layer 18 in a usual way, thereby filling the recess 15 at the planned gate area. Although polycrystalline silicon or possibly amorphous silicon or Ge$_x$Si$_{1-x}$, can be used, the conductive layer 20 preferably comprises a metal such as aluminum, tungsten, copper or molybdenum, or a combination of metals. It is to be noted, that the conductive layer 20 may also be applied as a double-layer consisting of a layer comprising a metal such as aluminum, tungsten, copper or molybdenum, or a combination of metals, on top of a layer acting as adhesion layer and/or barrier layer. In this respect Ti may be applied as adhesion layer and TiN or TiW as barrier layer.

Figure 9:
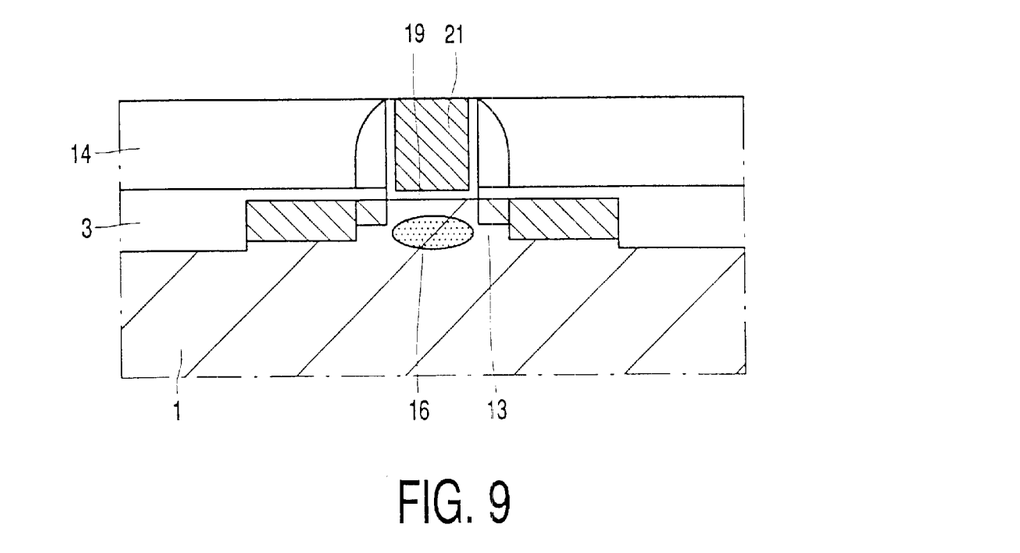

In a next step (FIG. 9), the conductive layer 20 is shaped into a gate 21 of the transistor. This can be done by means of, for example, etching using an oversized mask. In that case the conductive material of the gate 21 stretches over the dielectric layer 14, which is coated with the insulating layer 18, to beyond the recess 15 shown in FIG. 7. However, it is preferred to remove the conductive layer 20 in a maskless process until the insulating layer 18 is exposed, thereby forming the gate 21 which is recessed in the dielectric layer 14. An additional maskless removal of the insulating layer 18, the result of which is shown in FIG. 9, is not required, but can be beneficial in case the insulating layer 18 comprises a high-dielectric-constant material. Maskless removal of either the conductive layer 20 or both the conductive layer 20 and the insulating layer 18 is accomplished by means of, for example, chemical-mechanical polishing (CMP), e.g. using a commercially available slurry.

Finally, the semiconductor device may be completed by conventional CMOS process flow steps (not shown) for oxide deposition, contact definition and metallization with one or more metal layers.

Figure 10:
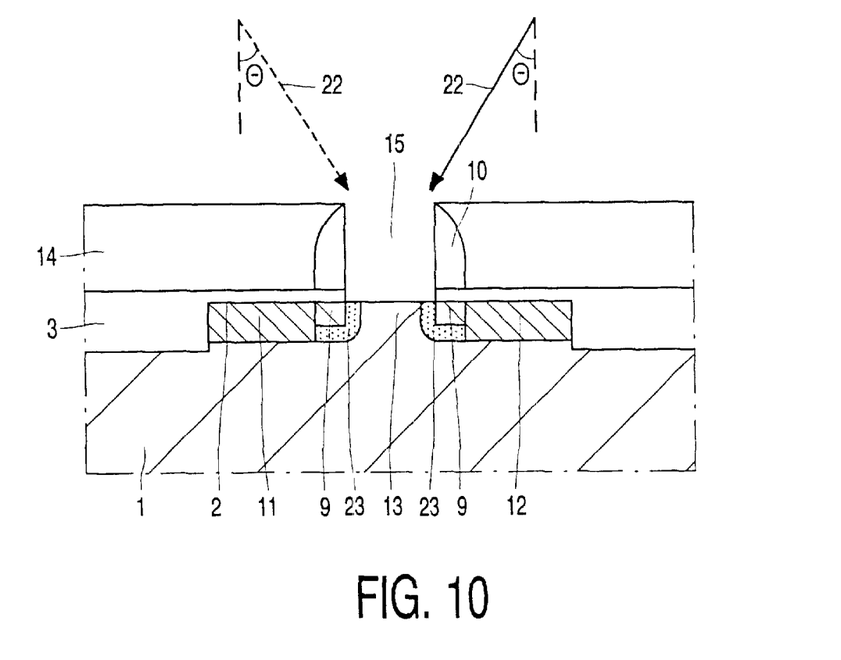
FIGS. 10 and 11 show in diagrammatic cross-sectional views two stages in the manufacture of a semiconductor device comprising a transistor, using a second embodiment of the method in accordance with the invention.
Figure 11:
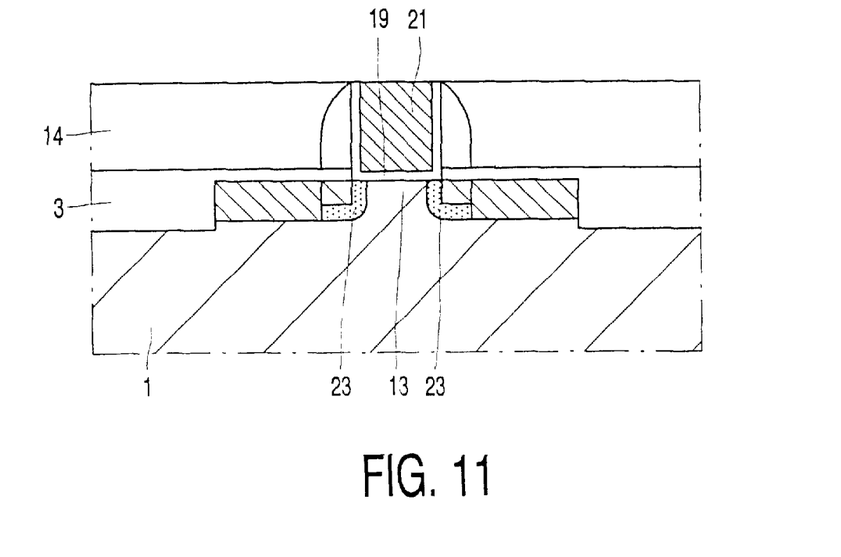

FIGS. 10 and 11 show in diagrammatic cross-sectional views two stages in the manufacture of a semiconductor device comprising a transistor, using a second embodiment of the method in accordance with the invention.

FIG. 10 shows the same situation as FIG. 6, with the exception that the ion implantation, as depicted by arrows 22, takes place at an acute angle θ with the normal to the surface 2 of the semiconductor body 1. The channel region 13 of the semiconductor body 1 is provided with impurity regions 23 of the first conductivity type, in the present example p-type, by implanting p-type impurities such as, for instance, boron (B) ions, at an angle θ lying in the range from about 15 to 75° via the recess 15 into the channel region 13 by using the dielectric layer 14 as a mask. Obviously, the maximum angle θ at which the impurities can be implanted into the channel region 13 is dependent on the aspect ratio of the recess 15 in the dielectric layer 14. The ion implantation is carried out in two steps, the semiconductor body 1 being rotated through 180° between the two steps. Naturally, circuit layouts with gates oriented at right angles to other gates require four implantations 90° apart. The impurity regions 23 can be applied as, for instance, shallow regions to correct the threshold voltage of the NMOS transistor and/or deeper regions to suppress punch-through between the extended source zone 11,9 and the extended drain zone 12,9 of the NMOS transistor. In this respect, boron may be implanted at an energy lying in the range from about 10 to 60 keV, in a dose of about $6.10^{12}$ to $4.10^{13}$ atoms/cm$^2$. It is understood by those skilled in the art that phosphorus (P) ions or arsenic (As) ions may be implanted in a PMOS transistor for similar reasons. For instance, phosphorus may be implanted at an energy lying in the range from about 60 to 90 keV, in a dose of about $6.10^{12}$ to $4.10^{13}$ atoms/cm$^2$, whereas arsenic may be implanted at an energy lying in the range from about 80 to 140 keV, in a dose of $6.10^{12}$ to $4.10^{13}$ atoms/cm$^2$. It is to be noted that just the extended drain zone 12,9 or the extended source zone 11,9 may be provided with an impurity region of the type indicated by reference numeral 23.

After the implantation of the impurity regions 23, similar steps as described with reference to FIGS. 7 to 9 are performed, the result of which is shown in FIG. 11.

Finally, the semiconductor device may be completed by conventional CMOS process flow steps (not shown) for oxide deposition, contact definition and metallization with one or more metal layers.

It will be apparent that the invention is not limited to the embodiments described above, but that many variations are possible to those skilled in the art within the scope of the invention. For instance, the source zone and the drain zone of the transistor can optionally be implanted without extensions. Evidently, the method of the invention can also be used to provide the channel region of the transistor with mutually divergent impurity regions by carrying out a plurality of implantations involving different types of impurities and different angles θ with the normal to the surface of the semiconductor body. Furthermore, in order to reduce the parasitic resistance of the source zone and the drain zone, the source zone and the drain zone may be subjected to a salicide process using Ti or Co, thereby forming self-aligned silicides of Ti(TiSi$_2$) or Co(CoSi$_2$), respectively, on the source zone and the drain zone. In the embodiments described above, the active region is provided by a surface region of the original semiconductor body. Alternatively, the active region may represent a conventional p or n well, which is obtained by means of locally doping the original semiconductor body in a region adjoining its surface with a doping concentration suitable for providing an n-channel or p-channel transistor.

What is claimed is:

1. A method of manufacturing a semiconductor device comprising a semiconductor body which is provided at a surface with a transistor having a gate insulated from a channel region at the surface of the semiconductor body by a gate dielectric, the gate having an area, by which method an active region of a first conductivity type adjoining the surface is defined in the semiconductor body, and a patterned layer is applied defining the area of the planned gate to be provided at a later stage of the process, after which a dielectric layer is applied, which dielectric layer is provided with a recess at the area of the planned gate by removing the patterned layer and any deeper layer up to the channel region, after which impurities are introduced via the recess into the channel region of the semiconductor body in a self-registered way by using the dielectric layer as a mask, and an insulating layer is applied, forming the gate dielectric of the transistor, on which insulating layer a conductive layer is applied thereby filling the recess on more than one side of the recess, which conductive layer is shaped into the gate of the transistor, characterized in that the patterned layer consisting of refractory material is applied, which patterned layer acts as a mask during the formation of a source zone and a drain zone of a second conductivity type in the semiconductor body, after which the dielectric layer is applied in a thickness which is sufficiently large to cover the patterned layer, which dielectric layer is removed over part of its thickness by means of a material removing treatment until the patterned layer is exposed, which patterned layer and any deeper layer up to the channel region is then removed.

2. A method as claimed in claim 1, characterized in that the impurities are introduced into the channel region of the semiconductor body by means of ion implantation.

3. A method as claimed in claim 2, characterized in that the impurities are implanted into the channel region at an acute angle with the normal to the surface of the semiconductor body.

4. A method as claimed in claim 1, characterized in that the channel region is provided with an impurity region for reaching an effect selected from punchthrough suppression, threshold voltage correction, and punchthrough suppression and threshold voltage correction.

5. A method as claimed in claim 1, characterized in that the patterned layer is applied by depositing and patterning a layer comprising silicon.

6. A method as claimed in claim 5, characterized in that the layer comprising silicon is applied as a double-layer including a first sub-layer comprising the silicon and on top thereof a second sub-layer composed of a material having a larger resistance the material removing treatment than silicon and being selectively etchable with respect to the dielectric layer.

7. A method as claimed in claim 6, characterized in that silicon oxide is applied as the dielectric layer and the second sub-layer is applied by depositing a layer comprising silicon nitride.

8. A method as claimed in claim 1, characterized in that, after applying the conductive layer filling the recess, the conductive layer is shaped into the gate by maskless removing the conductive layer until either the insulating layer or the dielectric layer is exposed.

9. A method as claimed in claim 8, characterized in that the conductive layer is removed by means of chemical-mechanical polishing.

10. A method as claimed in claim 1, characterized in that the conductive layer providing the gate is applied by depositing a layer comprising a metal.

11. A method as claimed in claim 10, characterized in that the conductive layer is applied as a further double-layer including a layer comprising the metal on top of a layer acting as an adhesion layer and/or barrier layer.

12. A method as claimed in claim 10, characterized in that one element of the group comprising aluminum, tungsten, copper and molybdenum is applied as the metal.

\* \* \* \* \*